(12) United States Patent
Lee

(10) Patent No.: US 9,954,052 B2
(45) Date of Patent: Apr. 24, 2018

(54) SEMICONDUCTOR DEVICE HAVING BUFFER LAYER AND METHOD OF FORMING THE SAME

(71) Applicant: SAMSUNG ELECTRONICS CO., LTD., Suwon-si, Gyeonggi-Do (KR)

(72) Inventor: Jaehoon Lee, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/958,146

(22) Filed: Dec. 3, 2015

(65) Prior Publication Data
US 2016/0163788 A1    Jun. 9, 2016

(30) Foreign Application Priority Data
Dec. 4, 2014 (KR) .......................... 10-2014-0173278

(51) Int. Cl.
*H01L 27/092* (2006.01)
*H01L 29/06* (2006.01)
(Continued)

(52) U.S. Cl.
CPC .. *H01L 29/0615* (2013.01); *H01L 21/823807* (2013.01); *H01L 21/823814* (2013.01);
(Continued)

(58) Field of Classification Search
CPC ............ H01L 29/7848; H01L 29/0615; H01L 29/165; H01L 27/0928; H01L 29/66636; H01L 29/1054; H01L 29/7834; H01L 29/16; H01L 29/66477; H01L 21/823418; H01L 21/02502; H01L 21/02645; H01L 21/28575; H01L 29/78687; H01L 29/772; H01L 29/20; H01L 29/78;
(Continued)

(56) References Cited

U.S. PATENT DOCUMENTS 7,429,775 B1 * 9/2008 Nayak ............ H01L 21/823807
257/288
7,525,161 B2    4/2009 Ieong et al.
(Continued)

FOREIGN PATENT DOCUMENTS

KR    1020030058681    7/2003

*Primary Examiner* — Eric Ward
*Assistant Examiner* — Eric Ashbahian
(74) *Attorney, Agent, or Firm* — F. Chau & Associates, LLC

(57) ABSTRACT

A semiconductor device is provided as follows. A substrate includes an NMOS region and a PMOS region. A first trench and a second trench are disposed in the NMOS region. A first buffer layer is disposed in the first trench and the second trench. A stressor is disposed in the first trench and the second trench and disposed on the first buffer layer. A first channel region is disposed between the first trench and the second trench and disposed in the substrate. A first gate electrode is disposed on the first channel area. A third trench is disposed in the PMOS region. A second buffer layer is disposed in the third trench. A second channel area is disposed in the third trench, disposed on the second buffer layer, and has a different semiconductor layer from the substrate. A second gate electrode is disposed on the second channel area.

16 Claims, 21 Drawing Sheets

(51) Int. Cl.
- H01L 29/10 (2006.01)
- H01L 29/16 (2006.01)
- H01L 21/8238 (2006.01)

(52) U.S. Cl.
CPC ........ H01L 27/092 (2013.01); H01L 29/1054 (2013.01); H01L 29/16 (2013.01); H01L 27/0928 (2013.01)

(58) Field of Classification Search
CPC ....... H01L 29/02367; H01L 21/823807; H01L 21/823814; H01L 21/02634; H01L 21/336; H01L 21/20; H01L 27/0922; C30B 25/183; C30B 29/403; Y10S 438/938; Y10T 428/2462
USPC ........................................................ 257/200
See application file for complete search history.

(56) References Cited

U.S. PATENT DOCUMENTS

| | | | |
|---|---|---|---|
| 7,586,153 B2 | 9/2009 | Hoentschel et al. | |
| 7,741,167 B2 | 6/2010 | Beyer et al. | |
| 8,853,060 B1* | 10/2014 | Lai | H01L 21/02532 438/478 |
| 8,962,428 B2* | 2/2015 | Chen | H01L 29/78 257/192 |
| 2008/0135894 A1 | 6/2008 | Bohr et al. | |
| 2009/0085125 A1* | 4/2009 | Kim | H01L 21/823807 257/369 |
| 2010/0301350 A1* | 12/2010 | Tamura | H01L 21/823807 257/77 |
| 2012/0126201 A1* | 5/2012 | Liu | H01L 21/0237 257/13 |
| 2013/0109144 A1* | 5/2013 | Kim | H01L 21/02532 438/301 |
| 2014/0001561 A1 | 1/2014 | Cheng et al. | |
| 2014/0087537 A1* | 3/2014 | Kim | H01L 29/66477 438/301 |
| 2014/0159052 A1* | 6/2014 | Liu | H01L 29/6659 257/77 |
| 2015/0001583 A1* | 1/2015 | Zhang | H01L 29/165 257/192 |
| 2015/0076560 A1* | 3/2015 | Wasyluk | H01L 29/7848 257/190 |
| 2015/0243494 A1* | 8/2015 | Hayden | H01L 21/0254 257/76 |
| 2015/0357436 A1* | 12/2015 | Shen | H01L 29/66636 257/190 |

* cited by examiner

NMOS

NMOS

US 9,954,052 B2

SEMICONDUCTOR DEVICE HAVING BUFFER LAYER AND METHOD OF FORMING THE SAME

CROSS-REFERENCE TO RELATED APPLICATION

This application claims priority under 35 U.S.C. § 119 to Korean Patent Application No. 10-2014-0173278 filed on Dec. 4, 2014, the disclosure of which is incorporated by reference herein in its entirety.

TECHNICAL FIELD

The present inventive concept relates to a semiconductor device having a buffer layer and a method of forming the same.

DISCUSSION OF RELATED ART

As transistors scale down in size, turn-on currents thereof may decrease. The decrease in turn-on currents may cause to decrease an operation speed of the transistor.

SUMMARY

According to an exemplary embodiment of the present inventive concept, a semiconductor device is provided as follows. A substrate includes an NMOS region and a PMOS region. A first trench and a second trench are disposed in the NMOS region. A first buffer layer is disposed in the first trench and the second trench. A stressor is disposed in the first trench and the second trench and disposed on the first buffer layer. A first channel region is disposed between the first trench and the second trench and disposed in the substrate. A first gate electrode is disposed on the first channel area. A third trench is disposed in the PMOS region. A second buffer layer is disposed in the third trench. A second channel area is disposed in the third trench, disposed on the second buffer layer, and has a different semiconductor layer from the substrate. A second gate electrode is disposed on the second channel area.

According to an exemplary embodiment of the present inventive concept, a semiconductor device is provided as follows. A first trench and a second trench are disposed in a substrate. A channel area is disposed between the first trench and the second trench and in the substrate. A gate electrode is disposed on the channel area. A buffer layer is disposed in the first trench and the second trench. A stressor is disposed in the first trench and the second trench and disposed on the buffer layer.

According to an exemplary embodiment of the present inventive concept, a semiconductor device is provided as follows. A drain area and a source area are disposed in a substrate. A trench is disposed between the drain area and the source area and disposed in the substrate. A buffer layer is disposed in the trench. A channel area is disposed in the trench, disposed on the buffer layer, and has a different semiconductor layer from the drain area and the source area. A gate electrode is disposed on the channel area.

According to an exemplary embodiment of the present inventive concept, a method of forming a semiconductor device is provided as follows. A first trench and a second trench are formed in a substrate. A first buffer layer is formed in the first trench and the second trench. A stressor is formed on the first buffer layer. A first channel area is formed in the substrate and between the first trench and the second trench. A first gate electrode is formed on the first channel area. A third trench is formed in the substrate. A second buffer layer is formed in the third trench. A second channel area is formed on the second buffer layer. The second channel area includes a different semiconductor layer from the substrate. A second gate electrode is formed on the second channel area.

According to an exemplary embodiment of the present inventive concept, a semiconductor device is provided as follows. A first well and a second well are disposed in a substrate. The first well and the second well are isolated from each other by a device isolation layer. A first trench and a second trench are disposed in the first well. A first channel region is disposed between the first trench and the second trench and disposed in the substrate. A first gate electrode is disposed on the first channel area. A third trench is disposed in the second well. A second channel area is disposed in the third trench. The second channel area is formed of a different semiconductor layer from the second well. A second gate electrode is disposed on the second channel area.

BRIEF DESCRIPTION OF THE DRAWINGS

These and other features of the inventive concept will become more apparent by describing in detail exemplary embodiments thereof with reference to the accompanying drawings of which.

Figure 1:
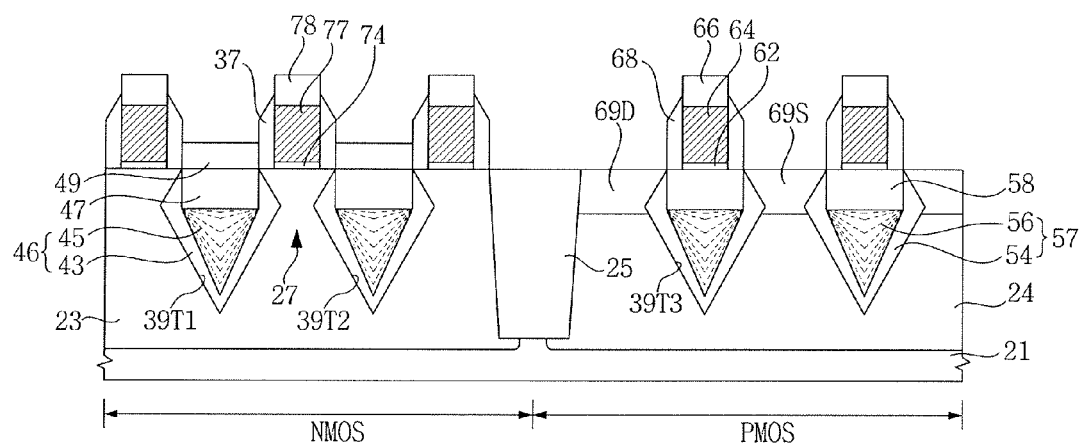
FIGS. 1 to 12 are cross-sectional views of semiconductor devices in accordance with exemplary embodiments of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIGS. 1 to 12 are cross-sectional views of semiconductor devices in accordance with exemplary embodiments of the present inventive concept.

Referring to FIG. 1, a semiconductor device in accordance with an exemplary embodiment of the present inventive concept includes a P-well 23, an N-well 24, a device isolation layer 25, a first spacer 37, a first trench 39T1, a second trench 39T2, a third trench 39T3, a first channel area 27, a first buffer layer 46, a stressor 47, an ohmic contact layer 49, a second buffer layer 57, a second channel area 58, a first gate dielectric layer 62, a first gate electrode 64, a first gate capping pattern 66, a second spacer 68, a drain area 69D, a source area 69S, a second gate dielectric layer 74, a second gate electrode 77, and a second gate capping pattern 78, which are formed on a substrate 21 including an NMOS region and a PMOS region. The first buffer layer 46 includes a first lower buffer layer 43 and a first upper buffer layer 45. The second buffer layer 57 includes a second lower buffer layer 54 and a second upper buffer layer 56.

The P-well 23, the first spacer 37, the first trench 39T1, the second trench 39T2, the first channel area 27, the first buffer layer 46, the stressor 47, the ohmic contact layer 49, the second gate dielectric layer 74, the second gate electrode 77, and the second gate capping pattern 78 are formed in the NMOS region. The N-well 24, the third trench 39T3, the second buffer layer 57, the second channel area 58, the first gate dielectric layer 62, the first gate electrode 64, the first gate capping pattern 66, the second spacer 68, the drain area 69D, and the source area 69S are formed in the PMOS region.

The substrate 21 may include Si, Ge, silicon on insulator (SOI), sapphire, glass, AlN, SiC, GaAs, InAs, graphene, CNT (carbon nanotube), a plastic, or a combination thereof. For example, the substrate 21 may be a single crystalline silicon wafer containing P-type impurities. The first channel area 27 is disposed between the first trench 39T1 and the second trench 39T2. The first channel area 27 may include single crystalline silicon containing P-type impurities. Lower portions of the first trench 39T1 and the second trench 39T2 are V-shaped. Sidewalls of the first trench 39T1 and the second trench 39T2 are C-shaped. For example, a left sidewall is "<"-shaped and a right sidewall is ">"-shaped.

The stressor 47 may be formed on the first buffer layer 46 in the first trench 39T1 and the second trench 39T2. The first buffer layer 46 surrounds a bottom and side surfaces of the stressor 47. The stressor 47 may be formed of a material having a different lattice constant from the first channel area 27. The stressor 47 may include a material having a smaller lattice constant than the first channel area 27. For example, the stressor 47 may include GaN. An upper end of the stressor 47 is substantially coplanar with an upper end of the first channel area 27.

The first buffer layer 46 is formed in the first trench 39T1 and the second trench 39T2. A bottom of the first buffer layer 46 is V-shaped. Sidewalls of the first buffer layer 46 is C-shaped (for example, a "<"-shape or a ">"-shape). The first buffer layer 46 may be formed of $Al_xGa_{1-x}N$ (0<X≤1) graded structure in which the content or doping of Al changes such that the content of Al of the first buffer layer 46 may decrease approaching the stressor 47 or upwardly toward the stressor 47. The content or doping of Al of the first buffer layer 46 may increase approaching the bottoms of the first trench 39T1 and the second trench 39T2.

The first lower buffer layer 43 is in direct contact with inner walls of the first trench 39T1 and the second trench 39T2. The first lower buffer layer 43 is also in direct contact with the first channel area 27. A bottom of the first lower buffer layer 43 is V-shaped. Sidewalls of the first lower buffer layer 43 are C-shaped (for example, a "<"-shape or a ">"-shape). The first lower buffer layer 43 is interposed between the stressor 47 and the first channel area 27. The first lower buffer layer 43 is in direct contact with side surfaces of the stressor 47. For example, the first lower buffer layer 43 may include AlN.

The first upper buffer layer 45 is formed on the first lower buffer layer 43 in the first trench 39T1 and the second trench 39T2. The first upper buffer layer 45 is in direct contact with the bottom of the stressor 47. The first upper buffer layer 45 may be formed of an $Al_xGa_{1-x}N$ (0<X≤1) graded structure. A content of Al in the first upper buffer layer 45 may decrease approaching the stressor 47. The content of Al in the first upper buffer layer 45 may increase approaching the bottoms of the first trench 39T1 and the second trench 39T2.

For example, the first upper buffer layer 45 may include sequentially stacked first layer to sixth layers. A first layer of the first upper buffer layer 45 may be an $Al_xGa_{1-x}N$ (0.7≤X<1) layer. A second layer of the first upper buffer layer 45 may be an $Al_xGa_{1-x}N$ (0.5≤X<0.7) layer and formed on the first layer. A third layer of the first upper buffer layer 45 may be an $Al_xGa_{1-x}N$ (0.3≤X<0.5) layer and formed on the second layer. A fourth layer of the first upper buffer layer 45 may be an $Al_xGa_{1-x}N$ (0.1≤X<0.3) layer and formed on the third layer. A fifth layer of the first upper buffer layer 45 may be an $Al_xGa_{1-x}N$ (0.05≤X<0.1) layer and formed on the fourth layer. A sixth layer of the first upper buffer layer 45 may be an $Al_xGa_{1-x}N$ (0<X<0.05) layer and formed on the fifth layer.

The ohmic contact layer 49 is formed on the stressor 47. An upper end of the ohmic contact layer 49 is raised to a higher level than the upper end of the first channel area 27. The ohmic layer 49 may include InGaN, a metal silicide, or a combination thereof. The second gate dielectric layer 74, the second gate electrode 77, and the second gate capping pattern 78 are formed on the first channel area 27. The first spacer 37 is formed on side surfaces of the second gate electrode 77 and the second gate capping pattern 78. The stressor 47 may serve as a source/drain.

A bottom of the third trench 39T3 is V-shaped. Sidewalls of the third trench 39T3 are C-shaped (for example, a "<"-shape or a ">"-shape). The second channel area 58 is formed on the second buffer layer 57 in the third trench 39T3. The second buffer layer 57 surrounds a bottom and side surfaces of the second channel area 58. The second channel area 58 may include a different semiconductor layer from the N-well 24. The second channel area 58 may include a semiconductor material having higher hole mobility compared to Si. For example, the N-well 24 may include single crystalline silicon containing N-type impurities, and the second channel area 58 may include a Ge layer including N-type impurities.

The second buffer layer 57 is formed in the third trench 39T3. A bottom of the second buffer layer 57 is V-shaped. Sidewalls of the second buffer layer 57 are C-shaped (for example, a "<"-shape or a ">"-shape). The second buffer layer 57 may include a $Si_yGe_{1-y}$ (0<y≤1) graded structure. A content of Ge in the second buffer layer 57 may change such that a content of Ge of the second buffer layer 57 may increase approaching the second channel area 58. The content of Ge in the second buffer layer 57 may decrease approaching the bottom of the third trench 39T3.

The second lower buffer layer 54 is in direct contact with inner walls of the third trench 39T3. The second lower buffer layer 54 is in direct contact with the N-well 24, the drain area 69D, and the source area 69S. A bottom of the second lower buffer layer 54 is V-shaped. Side surfaces of the second lower buffer layer 54 are C-shaped (for example, a "<"-shape or a ">"-shape). The second lower buffer layer 54 is interposed between the second channel area 58 and the drain area 69D, between the second channel area 58 and the source area 69S, between the second channel area 58 and the N-well 24, and between the second upper buffer layer 56 and the N-well 24. The second lower buffer layer 54 is in direct contact with the side surfaces of the second channel area 58. For example, the second lower buffer layer 54 may include a Si layer which may be epitaxially grown.

The second upper buffer layer 56 is formed on the second lower buffer layer 54 in the third trench 39T3. The second upper buffer layer 56 is in direct contact with the second channel area 58. The second upper buffer layer 56 may include a $Si_yGe_{1-y}$ (0<y≤1) graded structure. A content or doping of Ge in the second upper buffer layer 56 may change such that a content or doping of Ge in the second upper buffer layer 56 may increase approaching the second channel area 58 or upwardly toward the second channel area 58. The content of Ge in the second upper buffer layer 56 may decrease approaching the bottom of the third trench 39T3 or downwardly toward the third trench 39T3.

For example, the second upper buffer layer 56 may include sequentially stacked first layer to sixth layers. A first layer of the second upper buffer layer 56 may be a $Si_yGe_{1-y}$ (0.7≤y≤1) layer. A second layer of the second upper buffer layer 56 may be a $Si_yGe_{1-y}$ (0.5≤y<0.7) layer and formed on the first layer. A third layer of the second upper buffer layer 56 may be a $Si_yGe_{1-y}$ (0.3≤y<0.5) layer and formed on the second layer. A fourth layer of the second upper buffer layer 56 may be a $Si_yGe_{1-y}$ (0.1≤y<0.3) layer and formed on the third layer. A fifth layer of the second upper buffer layer 56 may be a $Si_yGe_{1-y}$ (0.05≤y<0.1) layer and formed on the fourth layer. A sixth layer of the second upper buffer layer 56 may be a $Si_yGe_{1-y}$ (0<y<0.05) layer and formed on the fifth layer.

The first gate dielectric layer 62, the first gate electrode 64, and the first gate capping pattern 66 are formed on the second channel area 58. A center of the first gate electrode 64 is vertically aligned with a center of the second channel area 58. The second spacer 68 is formed on side surfaces of the first gate electrode 64 and the first gate capping pattern 66. The drain area 69D and the source area 69S are formed on the N-well 24 adjacent to the first gate electrode 64.

According to an exemplary embodiment of the present inventive concept, a tensile stress may be induced in the first channel area 27 due to the configuration of the stressor 47. The tensile stress generated by the stressor 47 may increases electron mobility of the first channel area 27. The first buffer layer 46 may serve to prevent generation of defects due to a difference in lattice constants between the stressor 47 and the P-well 23. The first buffer layer 46 may serve to prevent generation of cracks in the stressor 47. The V-shape of the first trench 39T1 and the second trench 39T2 may serve to release stress. Due to the configuration of the second channel area 58, hole mobility may increase. The second buffer layer 57 may serve to prevent generation of crystal growth defects in the second channel area 58.

Figure 2:
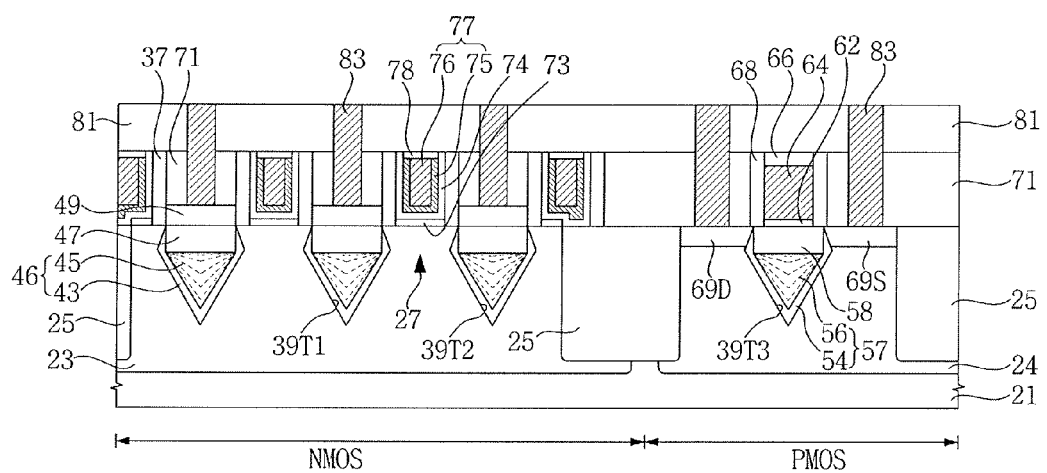

Referring to FIG. 2, a P-well 23, an N-well 24, a device isolation layer 25, a first spacer 37, a first trench 39T1, a second trench 39T2, a third trench 39T3, a first channel area 27, a first buffer layer 46, a stressor 47, an ohmic contact layer 49, a second buffer layer 57, a second channel area 58, a first gate dielectric layer 62, a first gate electrode 64, a first gate capping pattern 66, a second spacer 68, a drain area 69D, a source area 69S, a second lower gate dielectric layer 73, a second upper gate dielectric layer 74, a second gate electrode 77, a second gate capping pattern 78, a lower insulating layer 71, an upper insulating layer 81, and a contact plug 83 are formed on a substrate 21 including an NMOS region and a PMOS region. The first buffer layer 46 includes a first lower buffer layer 43 and a first upper buffer layer 45. The second buffer layer 57 includes a second lower buffer layer 54 and a second upper buffer layer 56. The second gate electrode 77 includes a lower gate electrode 75 and an upper gate electrode 76. The second gate electrode 77 may be referred to as a replacement gate electrode.

Figure 3:
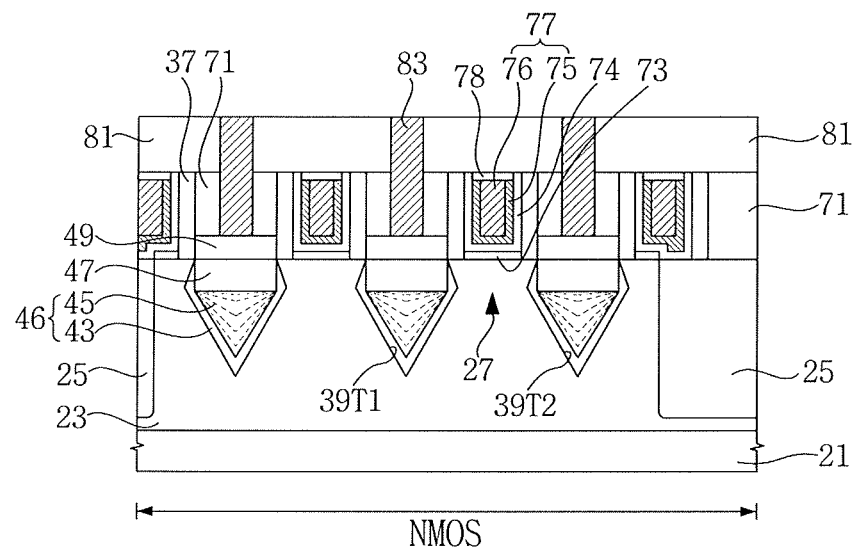

Referring to FIG. 3, a P-well 23, a device isolation layer 25, a first spacer 37, a first trench 39T1, a second trench 39T2, a first channel area 27, a first buffer layer 46, a stressor 47, an ohmic contact layer 49, a second lower gate dielectric layer 73, a second upper gate dielectric layer 74, a second gate electrode 77, a second gate capping pattern 78, a lower insulating layer 71, an upper insulating layer 81, and a contact plug 83 are formed on a substrate 21 including an NMOS region. The first buffer layer 46 includes a first lower buffer layer 43 and a first upper buffer layer 45. The second gate electrode 77 includes a lower gate electrode 75 and an upper gate electrode 76. Upper ends of the stressor 47 and the first channel area 27 are substantially coplanar. An interface between the stressor 47 and the first upper buffer layer 45 is formed of a horizontal plane.

Figure 4:
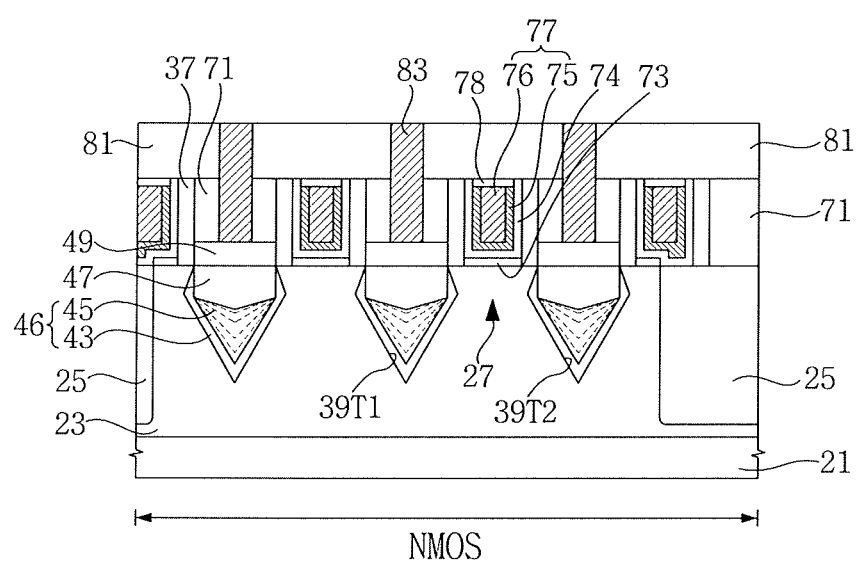

The semiconductor device of FIG. 4 is substantially similar to that of FIG. 3, except that the semiconductor device of FIG. 4 includes a V-shaped interface between a stressor 47 and a first upper buffer layer 45.

Figure 5:
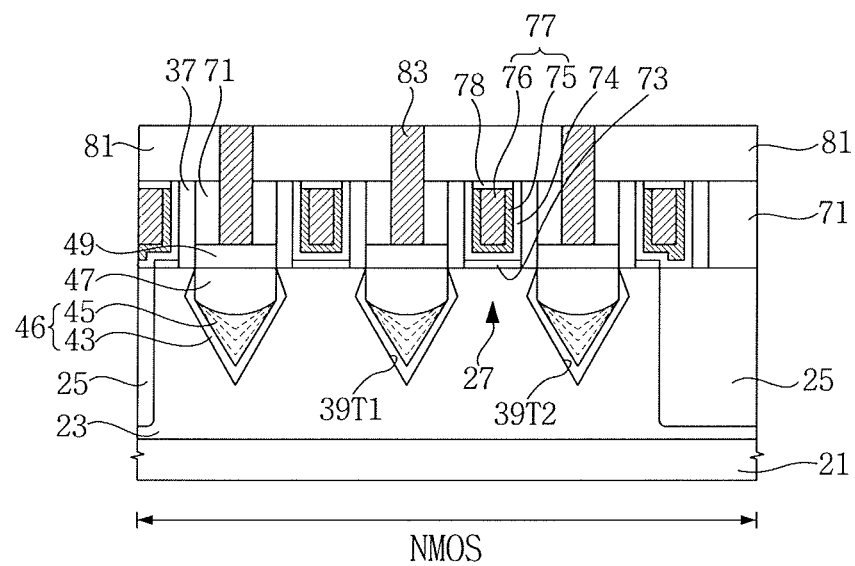

The semiconductor device of FIG. 5 is substantially similar to that of FIG. 3, except that the semiconductor device of FIG. 5 includes an U-shaped interface between a stressor 47 and a first upper buffer layer 45. The present inventive concept is not limited thereto. For example, the interface between the stressor 47 and the first upper buffer layer 45 may have a concave shape or a convex shape.

Figure 6:
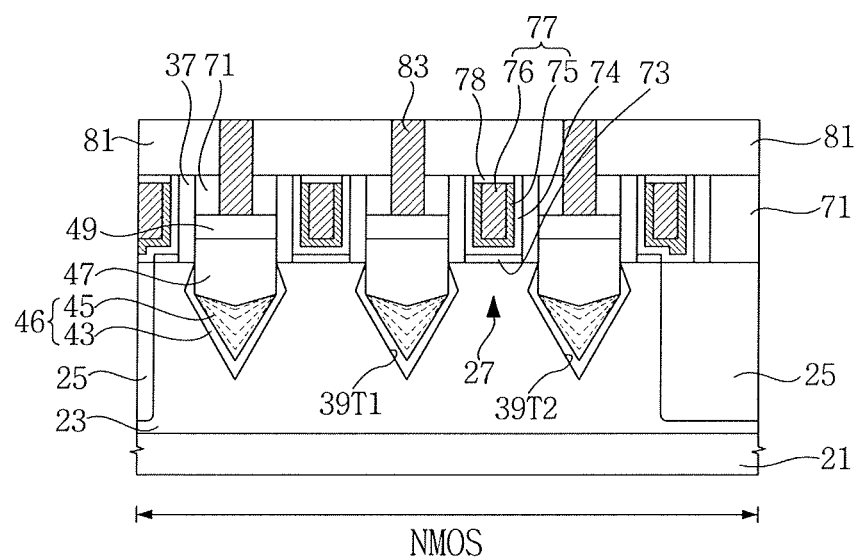

The semiconductor device of FIG. 6 is substantially similar to that of FIG. 4, except that an upper end of a stressor 47 of FIG. 6 is raised to a higher level than an upper end of a first channel area 27.

Figure 7:
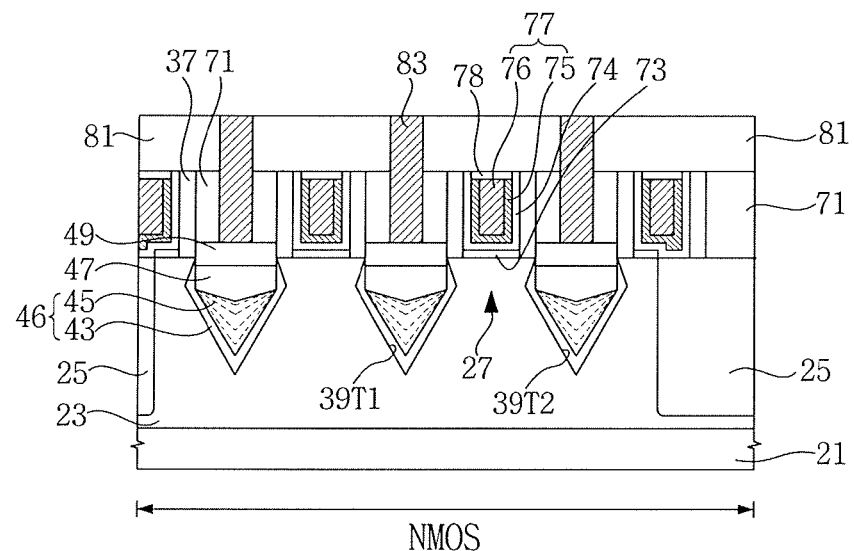

The semiconductor device of FIG. 7 is substantially similar to that of FIG. 4, except that an upper end of a stressor 47 of FIG. 7 is formed at a lower level than an upper end of a first channel area 27.

Figure 8:
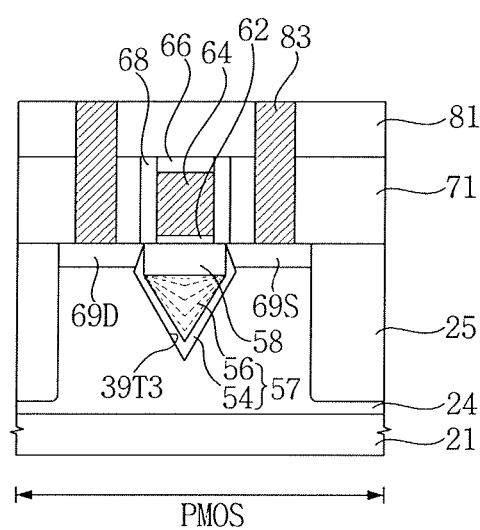

Referring to FIG. 8, an N-well 24, a device isolation layer 25, a third trench 39T3, a second buffer layer 57, a second channel area 58, a first gate dielectric layer 62, a first gate electrode 64, a first gate capping pattern 66, a second spacer 68, a drain area 69D, a source area 69S, a lower insulating layer 71, an upper insulating layer 81, and a contact plug 83 are formed on a substrate 21 including a PMOS region. The second buffer layer 57 includes a second lower buffer layer 54 and a second upper buffer layer 56. An upper end of the second channel area 58 is substantially coplanar with upper ends of the drain area 69D and the source area 69S.

Figure 9:
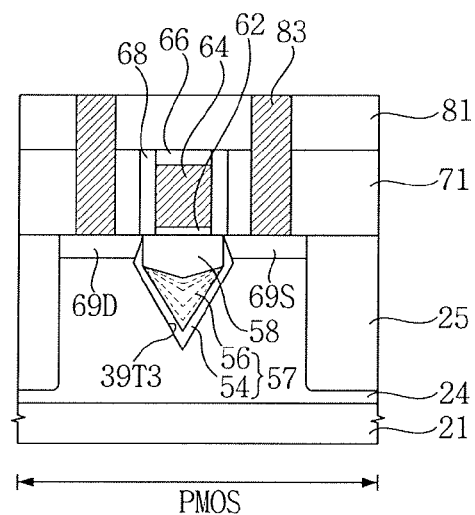

The semiconductor device of FIG. 9 is substantially similar to that of FIG. 8, except that an interface of FIG. 9 between a second channel area 58 and a second upper buffer layer 56 is V-shaped.

Figure 10:
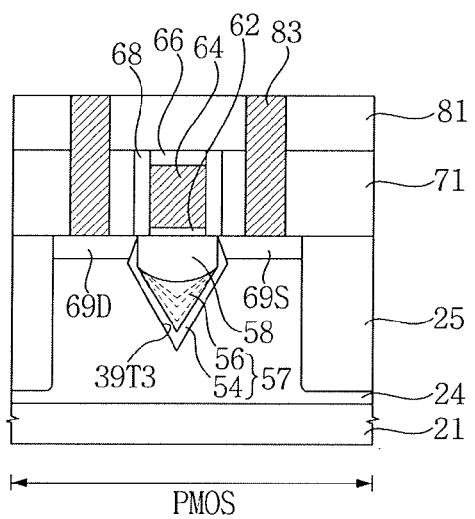

The semiconductor device of FIG. 10 is substantially similar to that of FIG. 8, except that an interface of FIG. 10 between a second channel area 58 and a second upper buffer layer 56 is U-shaped. The present inventive concept is not limited thereto. For example, the interface between the second channel area 58 and the second upper buffer layer 56 may have a concave shape or a convex shape.

Figure 11:
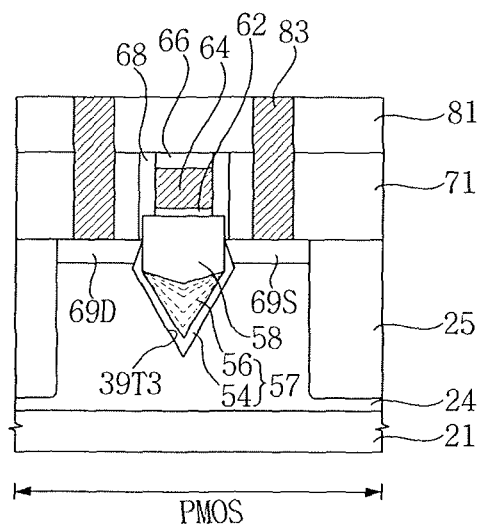

The semiconductor device of FIG. 11 is substantially similar to that of FIG. 9, except that an upper end of the second channel area 58 of FIG. 11 is raised to a higher level than upper ends of the drain area 69D and the source area 69S.

Figure 12:
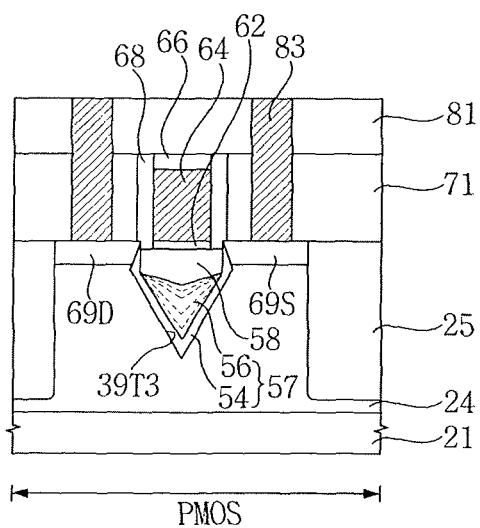

The semiconductor device of FIG. 12 is substantially similar to that of FIG. 9, except that an upper end of a second channel area 58 is formed at a lower level than upper ends of a drain area 69D and a source area 69S.

FIGS. 13 to 16 are cross-sectional views of a method of forming a semiconductor device in accordance with an exemplary embodiment of the present inventive concept.

Figure 13:
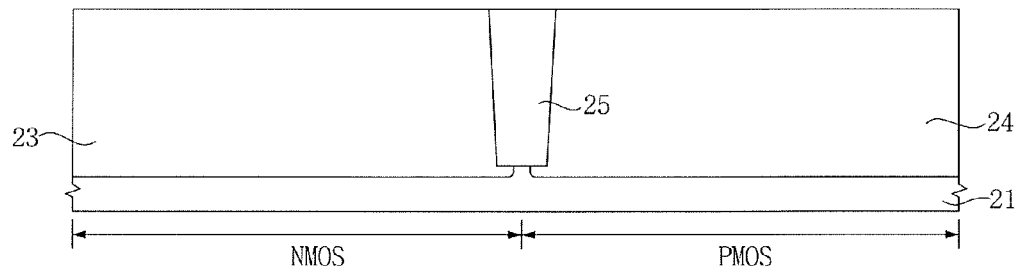
FIGS. 13 to 40 are cross-sectional views of methods of forming semiconductor devices in accordance with exemplary embodiments of the present inventive concept.

Referring to FIG. 13, a P-well 23, an N-well 24, and a device isolation layer 25 are formed on a substrate 21 including an NMOS region and a PMOS region. In some exemplary embodiments, the P-well 23 may be omitted.

Figure 14:
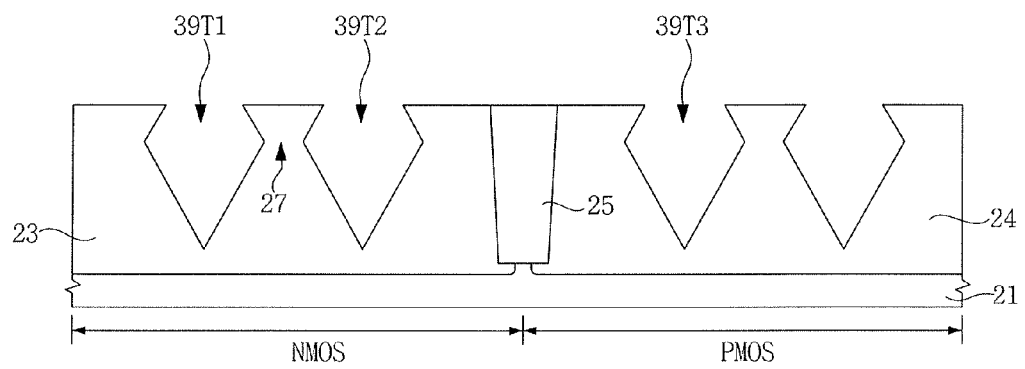

Referring to FIG. 14, a plurality of trenches 39T1, 39T2, and 39T3 are formed. The plurality of trenches 39T1, 39T2, and 39T3 includes a first trench 39T1, a second trench 39T2, and a third trench 39T3. The first trench 39T1 and the second trench 39T2 are formed in the P-well 23. A first channel area 27 is disposed between the first trench 39T1 and the second trench 39T2. The third trench 39T3 is formed in the N-well 24.

Figure 15:
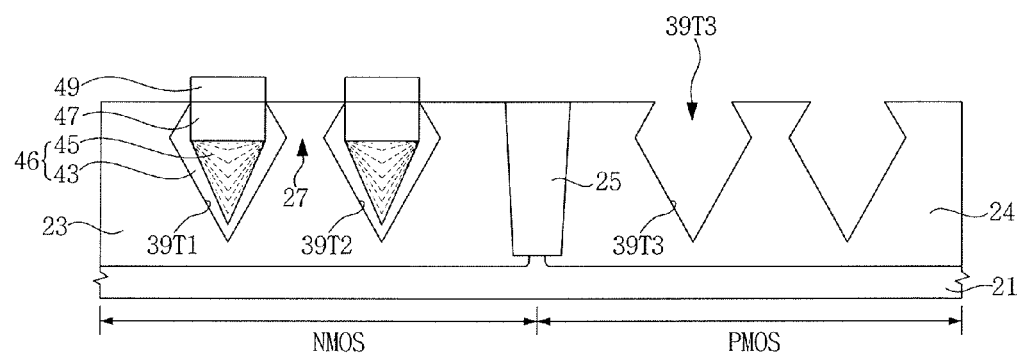

Referring to FIG. 15, a first lower buffer layer 43 is formed in the first trench 39T1 and the second trench 39T2. A first upper buffer layer 45 is formed on the first lower buffer layer 43. The first lower buffer layer 43 and the first upper buffer layer 45 constitute a first buffer layer 46. A stressor 47 is formed on the first buffer layer 46. An ohmic contact layer 49 is formed on the stressor 47.

Figure 16:
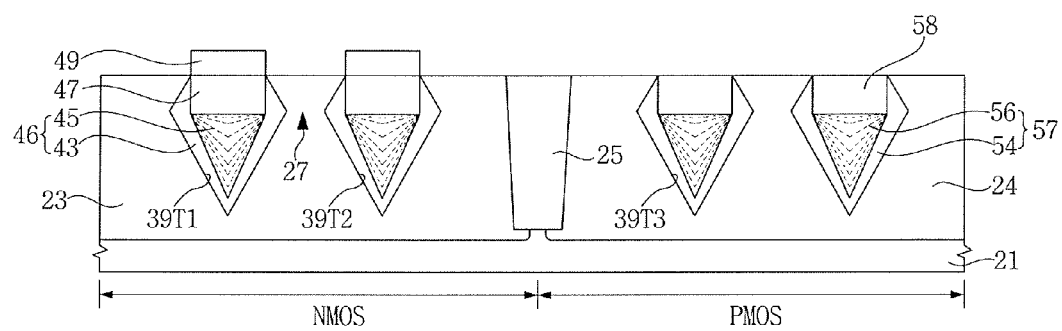

Referring to FIG. 16, a second lower buffer layer 54 is formed in the third trench 39T3. A second upper buffer layer 56 is formed on the second lower buffer layer 54. The second lower buffer layer 54 and the second upper buffer layer 56 constitute a second buffer layer 57. A second channel area 58 is formed on the second buffer layer 57.

Referring back to FIG. 1, the second gate dielectric layer 74, the second gate electrode 77, and the second gate capping pattern 78 are formed on the first channel area 27 of FIG. 16. The first spacer 37 is formed on side surfaces of the second gate electrode 77 and the second gate capping pattern 78.

The first gate dielectric layer 62, the first gate electrode 64, and the first gate capping pattern 66 are formed on the second channel area 58 of FIG. 16. A center of the first gate electrode 64 is vertically aligned with a center of the second channel area 58. The second spacer 68 is formed on side surfaces of the first gate electrode 64 and the first gate capping pattern 66. The drain area 69D and the source area 69S are formed in the N-well 24 adjacent to the first gate electrode 64.

FIGS. 17 to 40 are cross-sectional views for showing a method of forming a semiconductor device in accordance with an exemplary embodiment of the present inventive concept.

Figure 17:
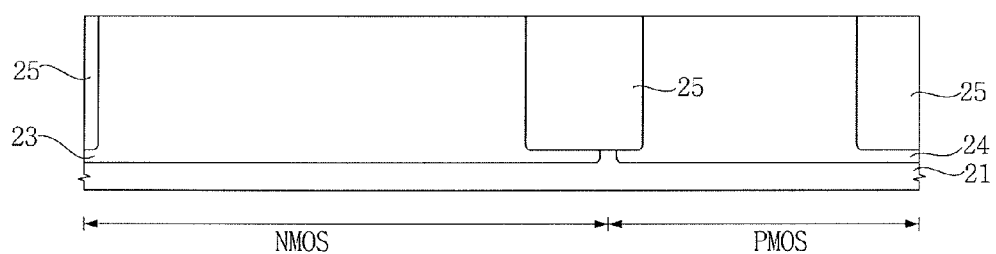

Referring to FIG. 17, a P-well 23, an N-well 24, and a device isolation layer 25 are formed on a substrate 21 including an NMOS region and a PMOS region.

The substrate 21 may be a single crystalline silicon wafer containing P-type impurities. The P-well 23 may single crystalline silicon containing P-type impurities. The N-well 24 may include single crystalline silicon containing N-type impurities. The device isolation layer 25 may be formed using a shallow trench isolation (STI) method. The device isolation layer 25 may include an insulating material, such as silicon oxide, silicon nitride, silicon oxynitride, or a combination thereof. In other exemplary embodiments, the P-well 23 may be omitted.

Figure 18:
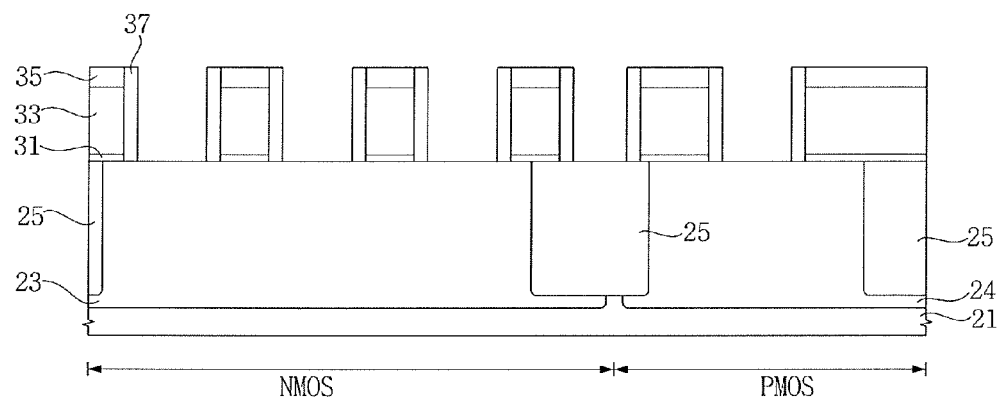

Referring to FIG. 18, a pad layer 31, a first mask pattern 33, a second mask pattern 35, and a first spacer 37 are formed on the substrate 21.

The pad layer 31 may include an insulating material such as silicon oxide. The first mask pattern 33 may include a material having etch selectivity with respect to the substrate 21. The second mask pattern 35 is formed on the first mask pattern 33. The second mask pattern 35 may include a material having etch selectivity with respect to the first mask pattern 33 and the substrate 21. For example, the first mask pattern 33 may include polysilicon, and the second mask pattern 35 may include silicon nitride. The process of forming the first mask pattern 33 and the second mask pattern 35 may include a thin-film formation process and a patterning process. The first spacer 37 may cover side surfaces of the first mask pattern 33 and the second mask pattern 35. The process of forming the first spacer 37 may include a thin-film formation process and an anisotropic etching process. The first spacer 37 may include silicon nitride, silicon oxide, silicon oxynitride, or a combination thereof. For example, the first spacer 37 may include silicon nitride.

Figure 19:
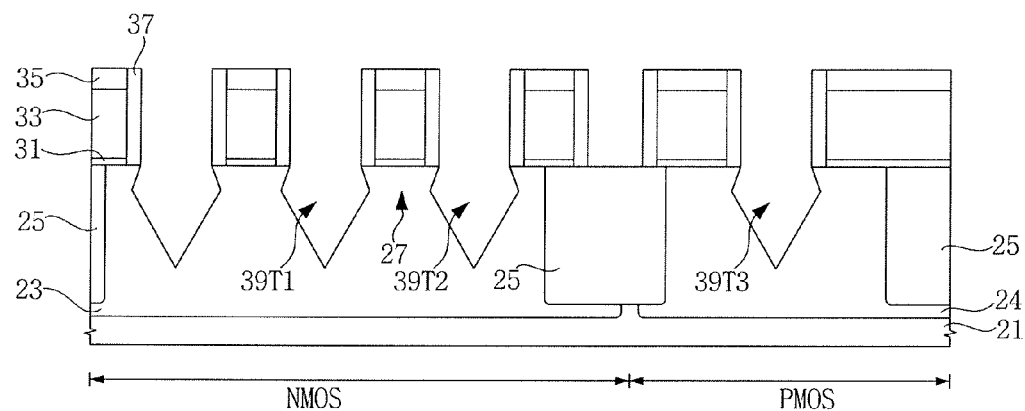

Referring to FIG. 19, a plurality of trenches 39T1, 39T2, and 39T3 are formed by partially removing the P-well 23 and the N-well 24 by using the first mask pattern 33, the second mask pattern 35, and the first spacer 37 as an etch mask. The plurality of trenches 39T1, 39T2, and 39T3 includes a first trench 39T1, a second trench 39T2, and a third trench 39T3. The first trench 39T1 and the second trench 39T2 are formed in the P-well 23. A first channel area 27 is disposed between the first trench 39T1 and the second trench 39T2. The third trench 39T3 is formed in the N-well 24.

The process of forming the plurality of trenches 39T1, 39T2, and 39T3 may include an anisotropic etching process, an isotropic etching process, a directional etching process, or a combination thereof. Lower portions of the plurality of trenches 39T1, 39T2, and 39T3 are V-shaped. Sidewalls of the plurality of trenches 39T1, 39T2, and 39T3 are C-shaped (for example, a "<"-shape or a ">"-shape). The first channel area 27 is formed in the P-well 23. The first channel area 27 may include single crystalline silicon containing P-type impurities. The bottoms of the plurality of trenches 39T1, 39T2, and 39T3 are formed at a higher level than a lower end of the device isolation layer 25.

In other exemplary embodiments, each of the plurality of trenches 39T1, 39T2, and 39T3 may be U-shaped.

Figure 20:
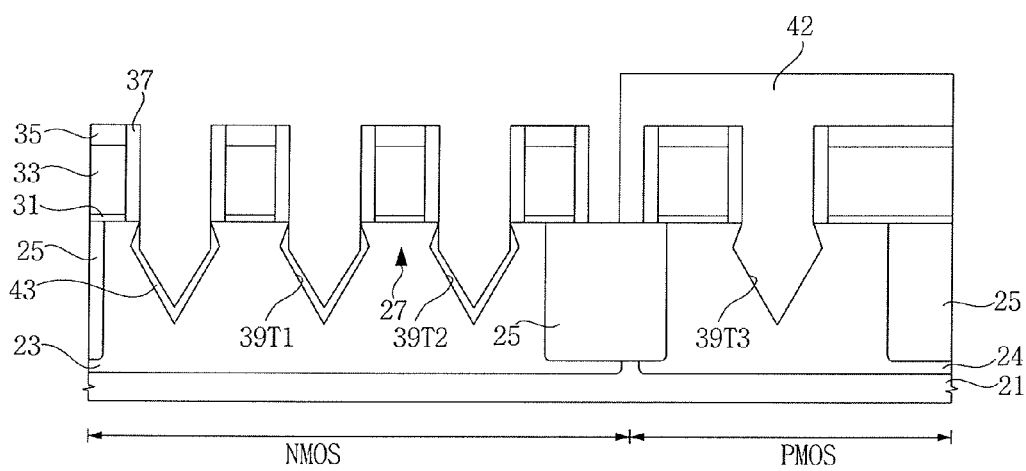

Referring to FIG. 20, a third mask pattern 42 covering the PMOS region and exposing the NMOS region is formed. A first lower buffer layer 43 is formed in the first trench 39T1 and the second trench 39T2.

The first lower buffer layer 43 is formed on inner walls of the first trench 39T1 and the second trench 39T2. The first lower buffer layer 43 may include a crystal growth material.

The first lower buffer layer 43 may include a different material from the first channel area 27. For example, the first lower buffer layer 43 may include MN.

Figure 21:
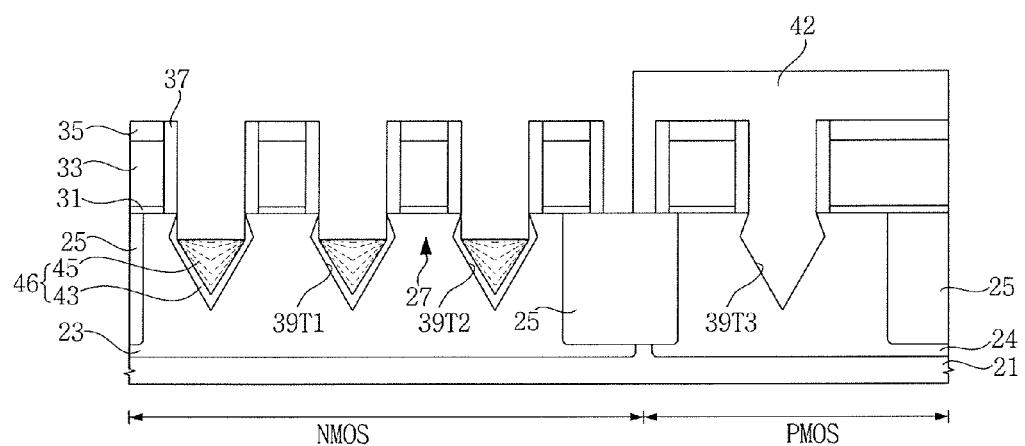

Referring to FIG. 21, a first upper buffer layer 45 is formed on the first lower buffer layer 43 in the first trench 39T1 and the second trench 39T2. The first lower buffer layer 43 and the first upper buffer layer 45 constitute a first buffer layer 46.

The first upper buffer layer 45 may include a crystal growth material. The first upper buffer layer 45 may be selectively formed on the first lower buffer layer 43. The first upper buffer layer 45 may include a different material from the first channel area 27. The first upper buffer layer 45 may include an $Al_xGa_{1-x}N$ (0<X≤1) graded structure. A content of Al in the first upper buffer layer 45 may increase approaching the bottoms of the first trench 39T1 and the second trench 39T2. An upper surface of the first upper buffer layer 45 may be flat.

For example, the first upper buffer layer 45 may include sequentially stacked first layer to sixth layers. A first layer of the first upper buffer layer 45 may be an $Al_xGa_{1-x}N$ (0.7≤X≤1) layer. A second layer of the first upper buffer layer 45 may be an $Al_xGa_{1-x}N$ (0.5≤X<0.7) layer and formed on the first layer. A third layer of the first upper buffer layer 45 may be an $Al_xGa_{1-x}N$ (0.3≤X<0.5) layer and formed on the second layer. A fourth layer of the first upper buffer layer 45 may be an $Al_xGa_{1-x}N$ (0.1≤X<0.3) layer and formed on the third layer. A fifth layer of the first upper buffer layer 45 may be an $Al_xGa_{1-x}N$ (0.05≤X<0.1) layer and formed on the fourth layer. A sixth layer of the first upper buffer layer 45 may be an $Al_xGa_{1-x}N$ (0<X<0.05) layer and formed on the fifth layer.

Figure 22:
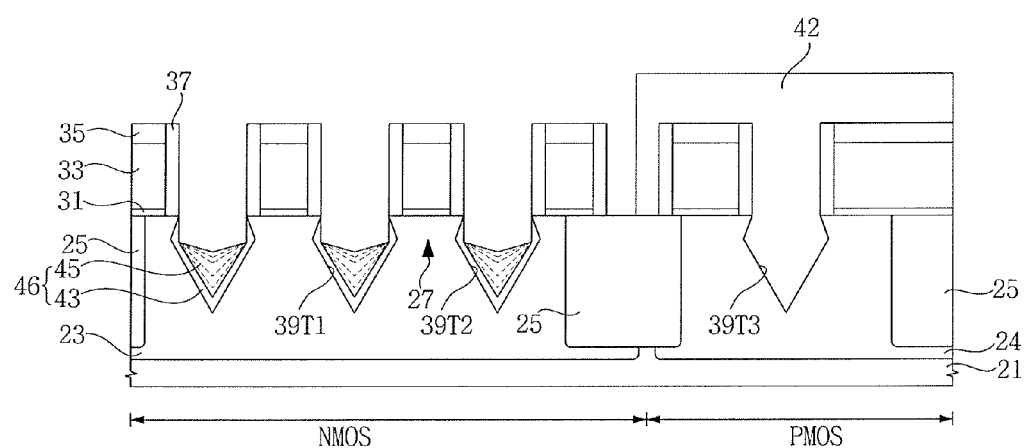

Referring to FIG. 22, an alternative structure of the first upper buffer layer 45 is shown. In FIG. 22, the upper surface of the first upper buffer layer 45 is V-shaped. A process condition may be controlled such that the upper surface of the first upper buffer layer 45 is V-shaped.

Figure 23:
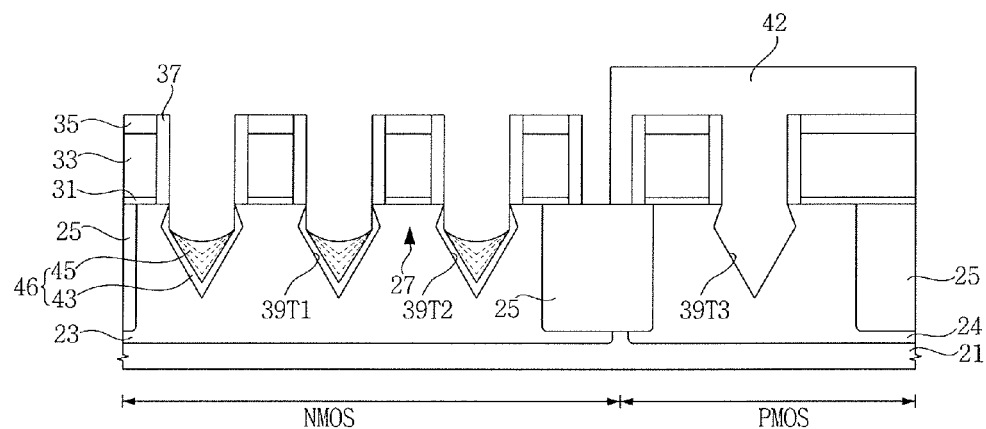

Referring to FIG. 23, an alternative structure of the first upper buffer layer 45 is shown. In FIG. 23, the upper surface of the first upper buffer layer 45 is U-shaped. A process condition may be controlled such that the upper surface of the first upper buffer layer 45 is U-shaped. The present inventive concept is not limited thereto, and the upper surface of the first upper buffer layer 45 may have a concave shape or a convex shape.

Figure 24:
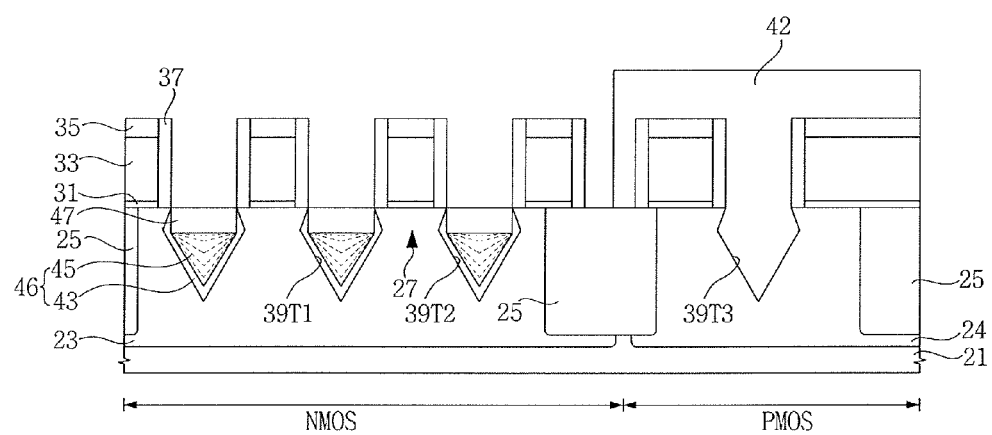

Referring to FIG. 24, a stressor 47 may be formed on the first buffer layer 46 in the first trench 39T1 and the second trench 39T2 of FIG. 21. The present inventive concept is not limited thereto, and the stressor 47 may be formed on the buffer layer 46 of FIGS. 22 to 23.

The stressor 47 may include a crystal growth material. The stressor 47 may include a material having a different lattice constant from the first channel area 27. The stressor 47 may include a material having a smaller lattice constant than the first channel area 27. For example, the stressor 47 may include GaN. The stressor 47 completely fills the first trench 39T1 and the second trench 39T2. An upper end of the stressor 47 is substantially coplanar with an upper end of the first channel area 27.

Figure 25:
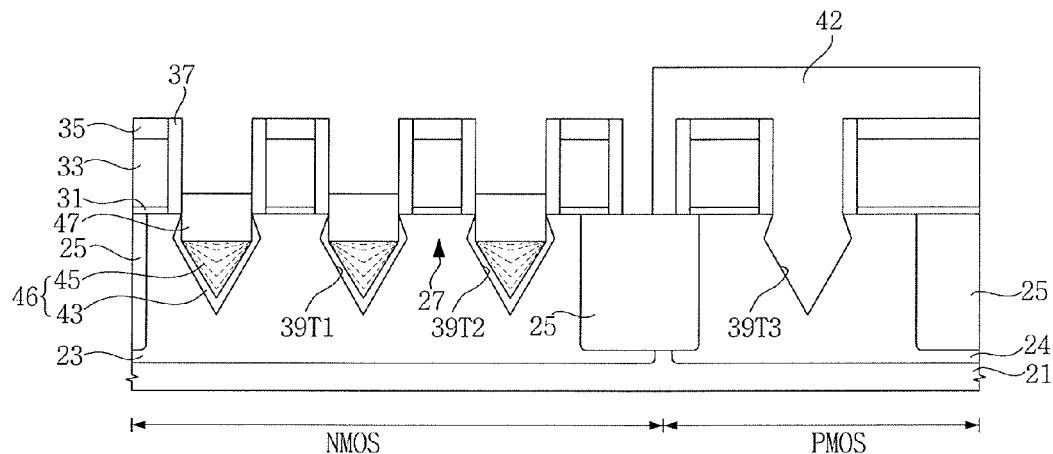

Alternatively, the stressor of FIG. 25 is formed so that the stressor 47 completely fills the first trench 39T1 and the upper end of the stressor 47 is raised to a higher level than the upper end of the first channel area 27.

Figure 26:
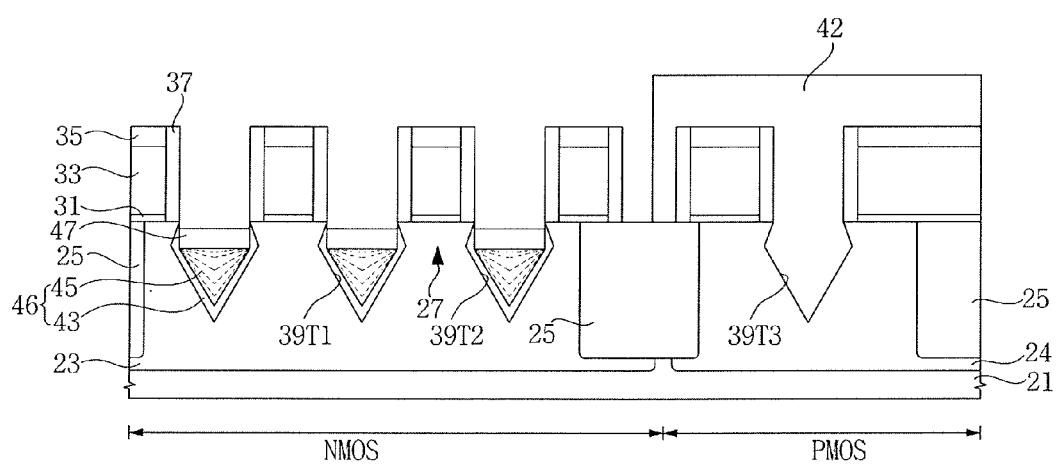

Alternatively, the stressor of FIG. 26 is formed so that the upper end of the stressor 47 is lower than the upper end of the first channel area 27.

Figure 27:
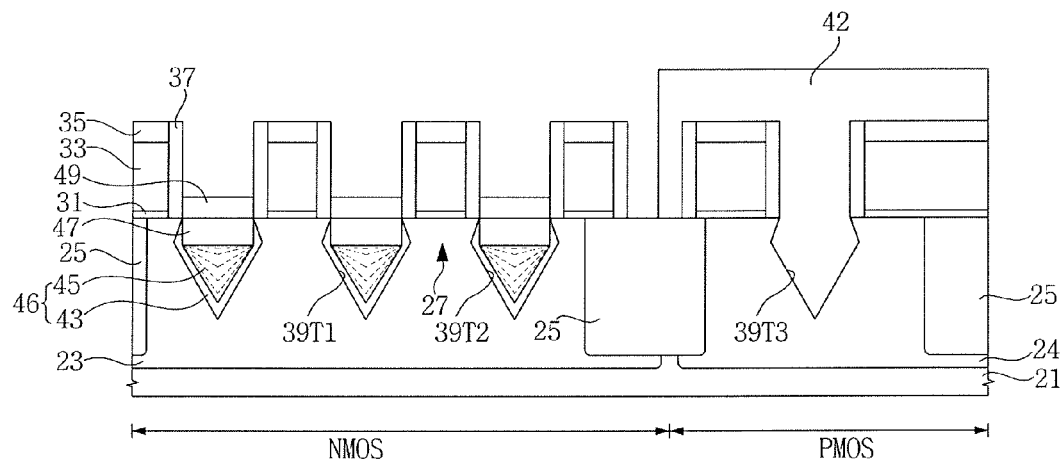

Referring to FIG. 27, an ohmic contact layer 49 is formed on the stressor 47 of FIG. 24. The present inventive concept is not limited thereto, and the ohmic contact layer 49 is formed on the stressor 47 of FIGS. 25 and 26. An upper end of the ohmic contact layer 49 is higher than the upper end of the first channel area 27. The ohmic contact layer 49 may include InGaN, a metal silicide, Si, or a combination thereof. The ohmic contact layer 49 is in contact with side surfaces of the first spacer 37.

Figure 28:
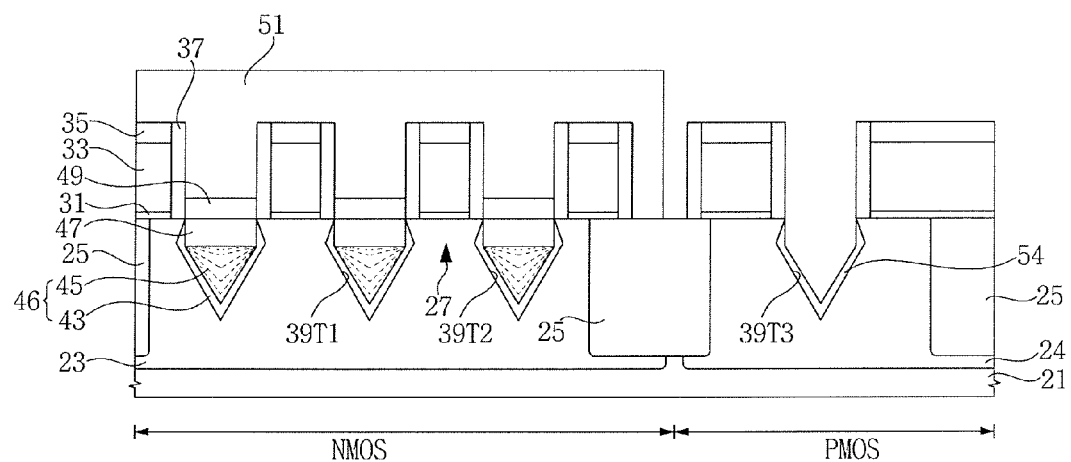

Referring to FIG. 28, the third mask pattern 42 is removed, and a fourth mask pattern 51 covering the NMOS region and exposing the PMOS region is formed. A second lower buffer layer 54 is formed in the third trench 39T3.

The second lower buffer layer 54 is formed along an inner wall of the third trench 39T3. The second lower buffer layer 54 may include a crystal growth material. The second lower buffer layer 54 may include the same material as the N-well 24. For example, the second lower buffer layer 54 may include a crystal growth Si layer. A bottom of the second lower buffer layer 54 is V shaped. Side surfaces of the second lower buffer layer 54 is C-shaped (for example, a "<"-shape or a ">"-shape).

Figure 29:
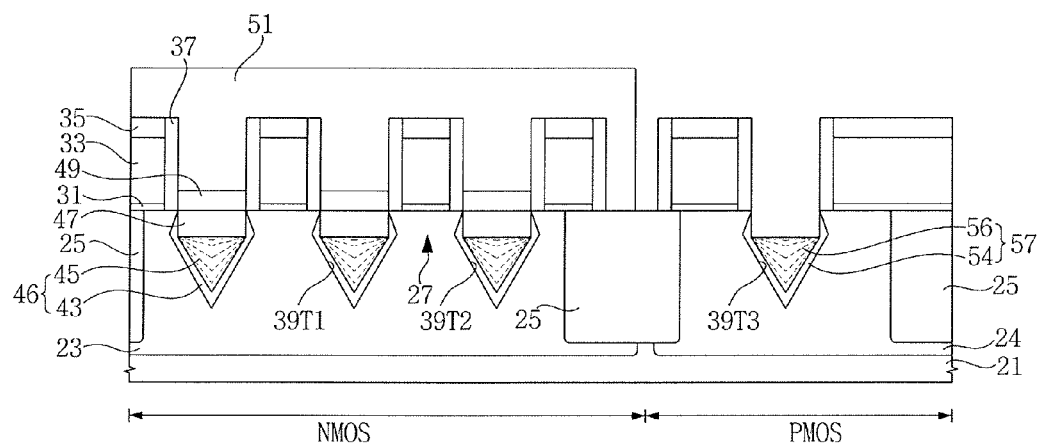

Referring to FIG. 29, a second upper buffer layer 56 is formed on the second lower buffer layer 54 in the third trench 39T3. The second lower buffer layer 54 and the second upper buffer layer 56 constitute a second buffer layer 57.

The second upper buffer layer 56 may include a crystal growth material. The second upper buffer layer 56 may be selectively formed on the second lower buffer layer 54. The second upper buffer layer 56 may include a different material from the N-well 24. The second upper buffer layer 56 may include a $Si_yGe_{1-y}$ (0<y≤1) graded structure. A content of Ge in the second upper buffer layer 56 may decrease approaching the bottom of the third trench 39T3.

For example, the second upper buffer layer 56 may include sequentially stacked first layer to sixth layers. A first layer of the second upper buffer layer 56 may be a $Si_yGe_{1-y}$ (0.7≤y<1) layer. A second layer of the second upper buffer layer 56 may be a $Si_yGe_{1-y}$ (0.5≤y<0.7) layer and formed on the first layer. A third layer of the second upper buffer layer 56 may be a $Si_yGe_{1-y}$ (0.3≤y<0.5) layer and formed on the second layer. A fourth layer of the second upper buffer layer 56 may be a $Si_yGe_{1-y}$ (0.1≤y<0.3) layer and formed on the third layer. A fifth layer of the second upper buffer layer 56 may be a $Si_yGe_{1-y}$ (0.05≤y<0.1) layer and formed on the fourth layer. A sixth layer of the second upper buffer layer 56 may be a $Si_yGe_{1-y}$ (0<y<0.05) layer and formed on the fifth layer.

Figure 30:
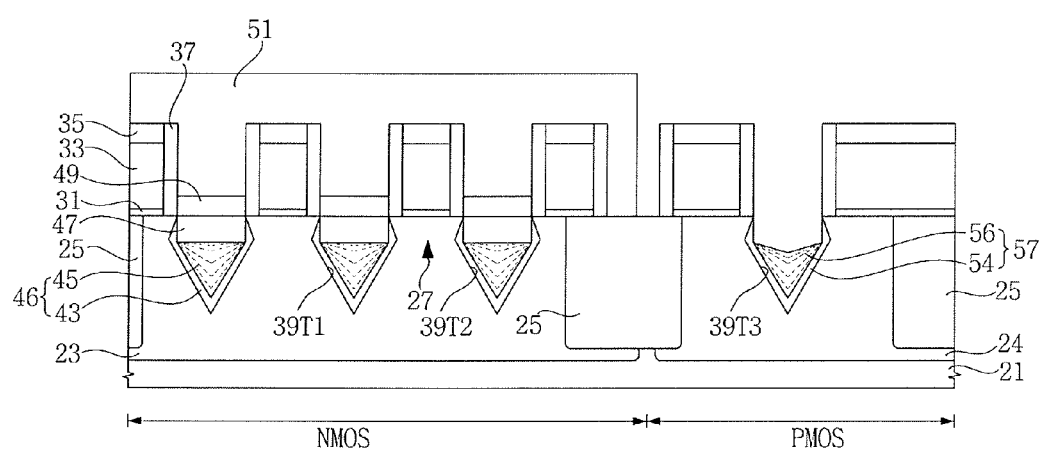

Alternatively, the formation of the second upper buffer layer 56 of FIG. 30 may be controlled such that an upper surface of the second upper buffer layer 56 may be V shaped.

Figure 31:
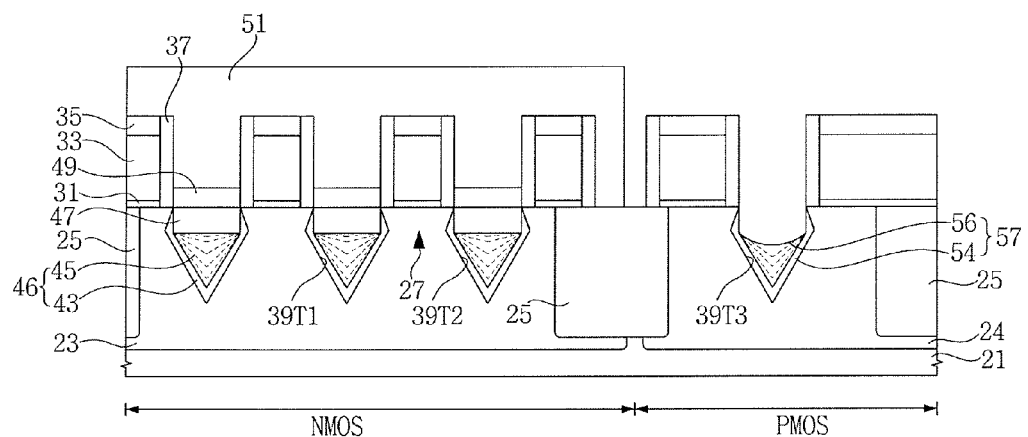

Alternatively, the formation of the second upper buffer layer 56 of FIG. 31 may be controlled that the upper surface of the second upper buffer layer 56 is U shaped. The present inventive concept is not limited thereto, and the upper surface of the second upper buffer layer 56 may have a concave shape or a convex shape.

Figure 32:
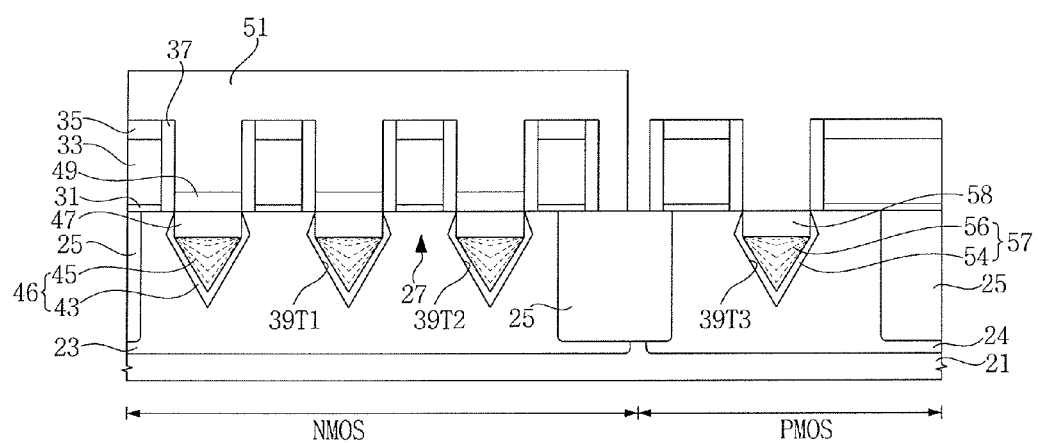

Referring to FIG. 32, a second channel area 58 is formed on the second buffer layer 57 in the third trench 39T3 of FIG. 29. The second channel area 58 may include a different semiconductor layer from the N-well 24. The second channel area 58 may include a crystal growth material. The second channel area 58 may include a material having higher hole mobility compared to Si. For example, the second channel area 58 may include a Ge layer containing N-type impurities. The second channel area 58 may completely fill the third trench 39T3. An upper end of the second channel area 58 is coplanar with an upper end of the N-well 24.

Figure 33:
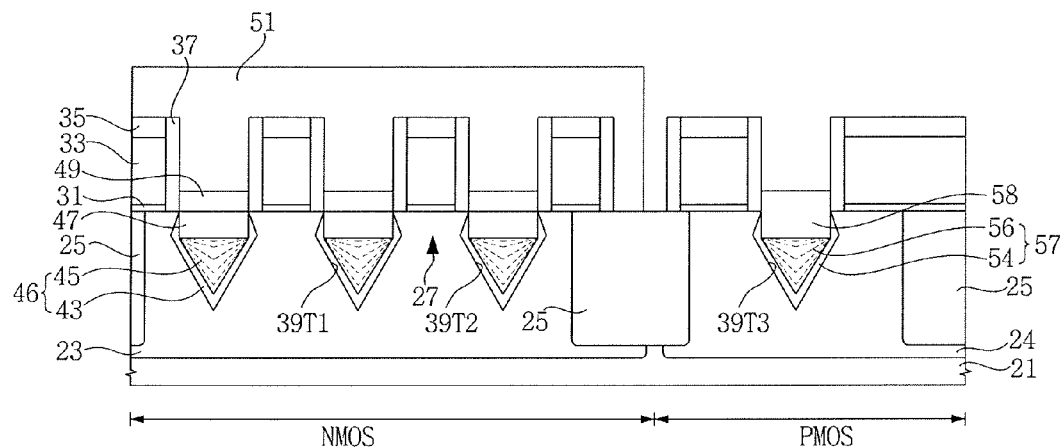

Alternatively, the second channel area 58 of FIG. 33 is formed so that the upper end of the second channel area 58 is raised to a higher level than the upper end of the N-well 24.

Figure 34:
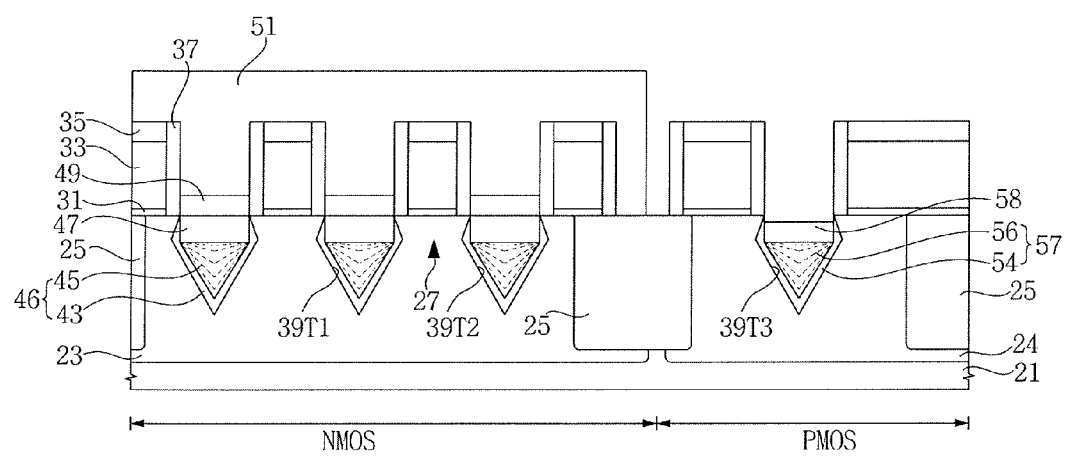

Alternatively, the second channel area 58 of FIG. 34 is formed so that the upper end of the second channel area 58 is lower than the upper end of the N-well 24.

Figure 35:
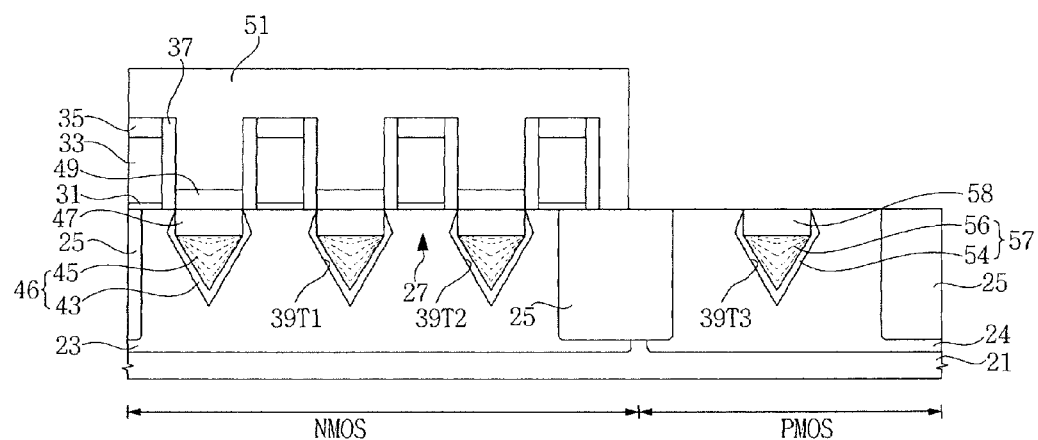

Referring to FIG. 35, the pad layer 31, the first mask pattern 33, the second mask pattern 35, and the first spacer 37, which are disposed on the PMOS region of FIG. 32, are removed. The N-well 24 and the second channel area 58 are exposed.

Figure 36:
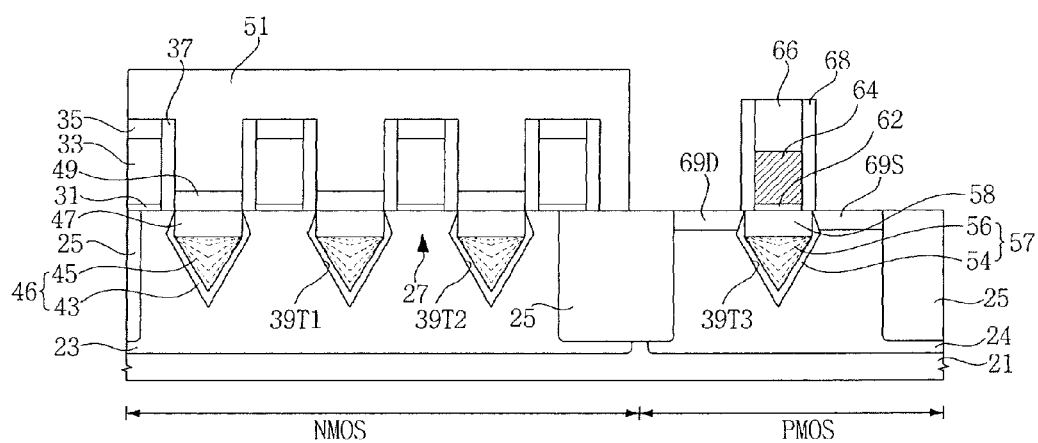

Referring to FIG. 36, a first gate dielectric layer 62, a first gate electrode 64, a first gate capping pattern 66, and a second spacer 68 are formed on the second channel area 58. A drain area 69D and a source area 69S are formed in the N-well 24.

The first gate dielectric layer 62 may include silicon oxide, silicon nitride, silicon oxynitride, a high-k dielectric, or a combination thereof. The first gate electrode 64 may include a metal, a metal nitride, a metal oxide, a metal silicide, polysilicon, conductive carbon, or a combination thereof. The first gate capping pattern 66 may include silicon oxide, silicon nitride, silicon oxynitride, or a combination thereof. The second spacer 68 may include silicon oxide, silicon nitride, silicon oxynitride, or a combination thereof. The drain area 69D and the source area 69S may be formed by implanting P-type impurities in the N-well 24.

Figure 37:
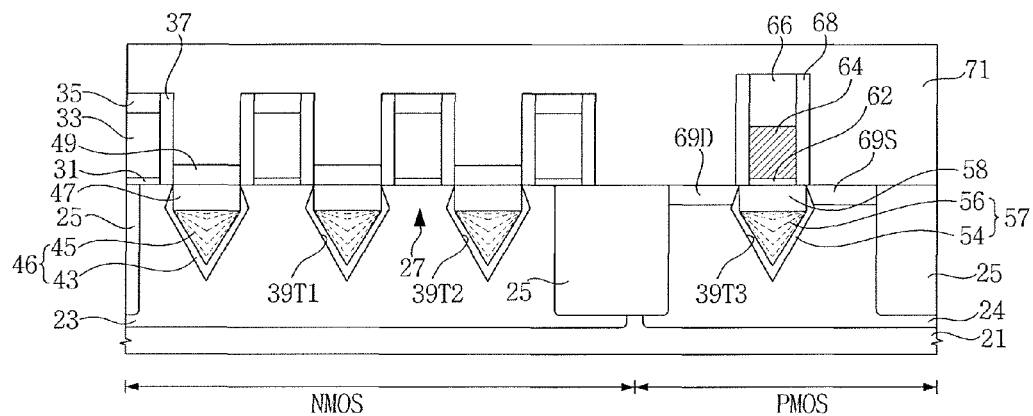

Referring to FIG. 37, the fourth mask pattern 51 is removed, and a lower insulating layer 71 covering the substrate 21 is formed. The lower insulating layer 71 may include silicon oxide, silicon nitride, silicon oxynitride, a low-k dielectric, or a combination thereof.

Figure 38:
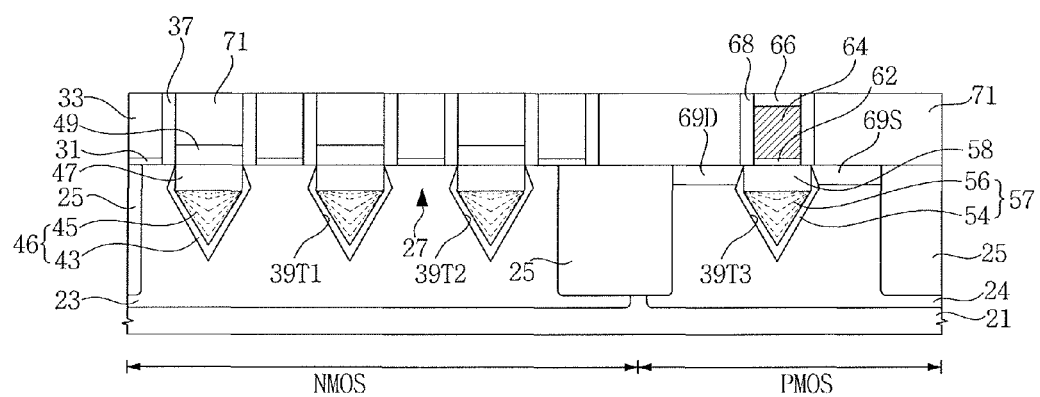

Referring to FIG. 38, the lower insulating layer 71 is planarized to expose the first mask pattern 33. The second mask pattern 35 is removed.

Figure 39:
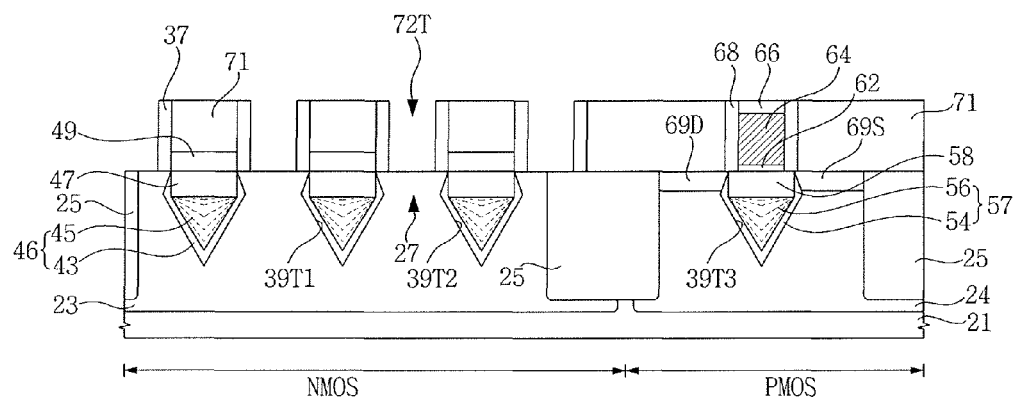

Referring to FIG. 39, the first mask pattern 33 and the pad layer 31 are removed to form a gate trench 72T. The first channel area 27 is exposed through the gate trench 72T.

Figure 40:
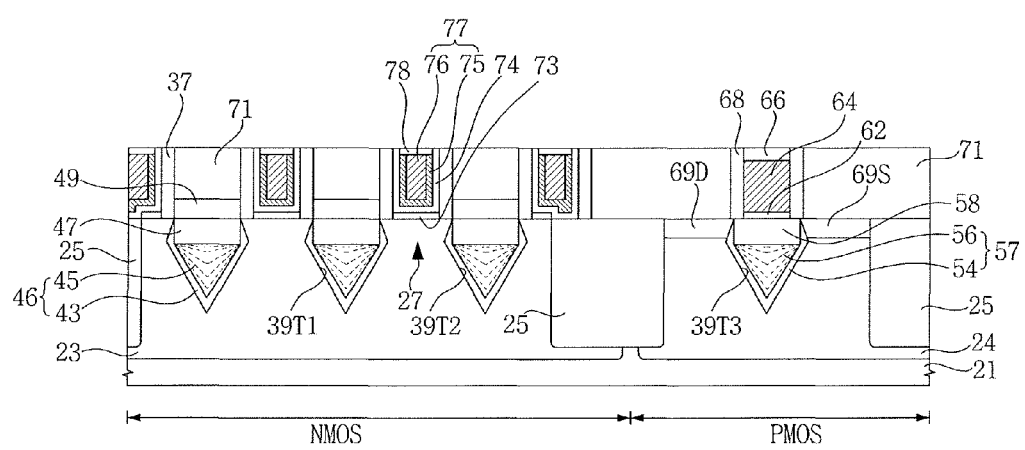

Referring to FIG. 40, a second lower gate dielectric layer 73, a second upper gate dielectric layer 74, a second gate electrode 77, and a second gate capping pattern 78 are formed in the gate trench 72T. The second gate electrode 77 includes a lower gate electrode 75 and an upper gate electrode 76.

The second lower gate dielectric layer 73 may include silicon oxide. The second lower gate dielectric layer 73 may be referred as an interfacial oxide or a chemical oxide. The second lower gate dielectric layer 73 may be formed by a chemical reaction of $H_2O_2$ and Si. The second lower gate dielectric layer 73 may be formed on the first channel area 27. The second lower gate dielectric layer 73 is in contact with the first channel area 27. The second upper gate dielectric layer 74 surrounds side surfaces and a bottom of the second gate electrode 77. The second upper gate dielectric layer 74 is interposed between the second lower gate dielectric layer 73 and the second gate electrode 77. The second upper gate dielectric layer 74 may include silicon oxide, silicon nitride, silicon oxynitride, a high-k dielectric, or a combination thereof.

The lower gate electrode 75 surrounds side surfaces and a bottom of the upper gate electrode 76. The lower gate electrode 75 may include a conductive layer to adjust a work function. The upper gate electrode 76 may include a metal, a metal nitride, a metal oxide, a metal silicide, polysilicon, conductive carbon, or a combination thereof. The second gate electrode 77 may be referred to as a replacement gate electrode. The second gate capping pattern 78 may include silicon oxide, silicon nitride, silicon oxynitride, or a combination thereof. For example, the second gate capping pattern 78 may include silicon nitride.

Referring back to FIG. 2, the upper insulating layer 81 is formed on the lower insulating layer 71 of FIG. 40. The contact plug 83 passing through the upper insulating layer 81 and the lower insulating layer 71 is formed. The upper insulating layer 81 may include silicon oxide, silicon nitride, silicon oxynitride, or a combination thereof. The contact plug 83 may include a metal layer, a metal nitride layer, a metal oxide layer, a metal silicide layer, a polysilicon layer, or a combination thereof.

Figure 41:
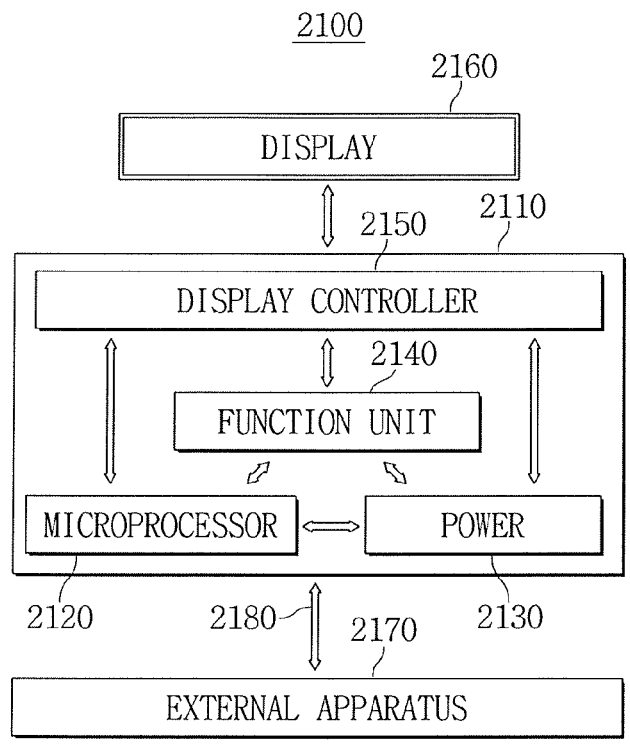
FIGS. 41 and 42 are system block diagrams of electronic apparatuses in accordance with exemplary embodiments of the present inventive concept.
Figure 42:
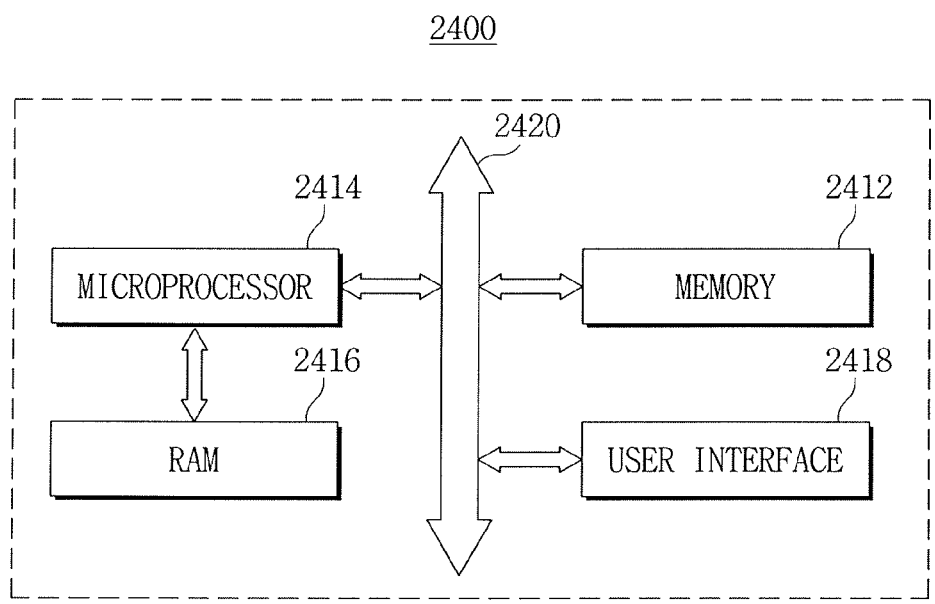

FIGS. 41 and 42 are a system block diagrams of electronic systems in accordance with exemplary embodiments of the present inventive concept.

Referring to FIG. 41, a semiconductor device in accordance with an exemplary embodiment may be applied to an electronic system 2100. The electronic system 2100 includes a body 2110, a microprocessor 2120, a power unit 2130, a function unit 2140, and a display controller 2150. The body 2110 may be a motherboard formed of a printed circuit board (PCB). The microprocessor 2120, the power unit 2130, the function unit 2140, and the display controller 2150 may be installed on the body 2110. A display 2160 may be disposed inside or outside the body 2110. For example, the display 2160 is disposed on a surface of the body 2110 and displays an image processed by the display controller 2150.

The power unit 2130 may receive a constant voltage from an external battery, etc., divide the voltage into various levels of required voltages, and supply those voltages to the microprocessor 2120, the function unit 2140, and the display controller 2150, etc. The microprocessor 2120 may receive a voltage from the power unit 2130 to control the function unit 2140 and the display 2160. The function unit 2140 may perform various functions of the electronic system 2100. For example, when the electronic system 2100 is a smartphone, the function unit 2140 may have several components which perform functions of a mobile phone such as output of an image to the display 2160 or output of a voice to a speaker, by dialing or communication with an external apparatus 2170. When a camera is installed, the function unit 2140 may function as a camera image processor.

If the electronic system 2100 is connected to a memory card, etc. to increase capacity thereof, the function unit 2140 may serve as a memory card controller. The function unit 2140 may exchange signals with the external apparatus 2170 through a wired or wireless communication unit 2180. Further, when the electronic system 2100 needs a Universal Serial Bus (USB), etc. in order to expand functionality, the function unit 2140 may function as an interface controller. Further, the function unit 2140 may include a mass storage apparatus.

A semiconductor device in accordance with an exemplary embodiment may be applied to the function unit 2140 or the microprocessor 2120. For example, the microprocessor 2120 may include the first buffer layer 46 and the second buffer layer 57 of FIGS. 1 to 40.

Referring to FIG. 42, an electronic system 2400 may include a semiconductor device in accordance with an exemplary embodiment of the present inventive concept. The electronic system 2400 may be included in a mobile apparatus or a computer. For example, the electronic system 2400 includes a memory system 2412, a microprocessor 2414, a random access memory (RAM) 2416, a bus 2420, and a user interface 2418. The microprocessor 2414, the memory system 2412, and the user interface 2418 may be connected to each other via the bus 2420. The user interface 2418 may be used to input data to or output data from the electronic system 2400. The microprocessor 2414 may program and control the electronic system 2400. The RAM 2416 may be used as an operational memory of the microprocessor 2414. The microprocessor 2414, the RAM 2416, and/or other components may be assembled in a single package. The memory system 2412 may store codes for operating the microprocessor 2414, data processed by the microprocessor 2414, or external input data. The memory system 2412 may include a controller and a memory device.

A semiconductor device in accordance with an exemplary embodiment of the present inventive concept may be applied to the microprocessor 2414, the RAM 2416, and the memory system 2412.

According to an exemplary embodiment of the present inventive concept, a stressor may be formed on a first buffer layer in an NMOS region. The stressor may apply a tensile stress to the first channel area so that electron mobility may increase. The first buffer layer may serve to prevent generation of cracks in the stressor. A second channel area may be formed on a second buffer layer in a PMOS region. The second channel area may apply a compress stress to the second channel area so that hole mobility may increase. The second buffer layer may serve to prevent generation of crystal growth defects in the second channel area. In accordance with an exemplary embodiment, a semiconductor device may operate fast due increased mobility of electron and/or hole carriers.

While the present invention has been shown and described with reference to exemplary embodiments thereof, it will be apparent to those of ordinary skill in the art that various changes in form and detail may be made therein without departing from the spirit and scope of the present invention as defined by the following claims. For example, the inventive concept may be expansively applied to a finFET (field effect transistor), a nanowire transistor, or a three-dimensional transistor.

What is claimed is:

1. A semiconductor device, comprising:
a substrate including an NMOS region and a PMOS region;
a first trench and a second trench disposed in the NMOS region;
a first buffer layer disposed in the first trench and the second trench;
a stressor disposed in the first trench and the second trench and disposed on the first buffer layer;
a first channel area disposed between the first trench and the second trench and disposed in the substrate;
a first gate electrode disposed on the first channel area;
a third trench disposed in the PMOS region;
a second buffer layer disposed in the third trench;
a second channel area disposed in the third trench, disposed on the second buffer layer, and having a different semiconductor layer from the substrate; and
a second gate electrode disposed on the second channel area,
wherein lower portions of the first trench, the second trench, and the third trench are V-shaped,
wherein the first buffer layer comprises a first lower buffer layer and a first upper buffer layer disposed on the first lower buffer layer, and a portion of the first lower buffer layer is in direct contact with a side surface of the stressor, wherein the first lower buffer layer covers substantially an entire side surface of the stressor, and wherein the first upper buffer layer covers substantially an entire bottom surface of the stressor, and
wherein the second channel area comprises a second lower buffer layer and a second upper buffer layer disposed on the second lower buffer layer, and a portion of the second lower buffer layer is in direct contact with a side surface of the second channel area.

2. The semiconductor device of claim 1,
wherein the stressor includes a material having a smaller lattice constant than the first channel area.

3. The semiconductor device of claim 2,
wherein the first channel area includes Si and the stressor includes GaN.

4. The semiconductor device of claim 2,
wherein the first buffer layer includes an $Al_xGa_{1-x}N$ ($0<X\leq1$) graded structure with an Al doping decreasing upwardly toward the stressor.

5. The semiconductor device of claim 4,
wherein the first lower buffer layer includes AlN and the stressor includes GaN.

6. The semiconductor device of claim 1,
wherein an interface between the stressor and the first buffer layer is concave or convex.

7. The semiconductor device of claim 1,
wherein an upper surface of the stressor is higher than an upper surface of the first channel area.

8. The semiconductor device of claim 1, further comprising an ohmic contact layer disposed on the stressor.

9. The semiconductor device of claim 8,
wherein the ohmic contact layer includes InGaN or a combination of InGaN and a metal silicide.

10. The semiconductor device of claim 1, wherein sidewalls of the first trench, the second trench, and the third trench are C-shaped.

11. The semiconductor device of claim 1,
Wherein the substrate includes Si and the second channel area includes Ge.

12. The semiconductor device of claim 1,
wherein the second buffer layer includes a $Si_yGe_{1-y}$ ($0<y\leq1$) graded structure with a Ge doping increasing upwardly toward the second channel area.

13. The semiconductor device of claim 12,
wherein the second lower buffer layer includes an epitaxial Si layer and the second lower buffer layer is interposed between the second upper buffer layer and a sidewall of the third trench.

14. The semiconductor device of claim 1,
wherein an interface between the second channel area and the second buffer layer is concave or convex.

15. A semiconductor device, comprising:
a first well and a second well disposed in a substrate, wherein the first well and the second well are isolated from each other by a device isolation layer;
a first trench and a second trench disposed in the first well;
a stressor disposed in the first trench and the second trench;
a first buffer layer disposed in the first trench and the second trench and under the stressor;
a first channel area disposed between the first trench and the second trench and disposed in the substrate;
a first gate electrode disposed on the first channel area;
a third trench disposed in the second well;
a second channel area disposed in the third trench;
a second buffer layer disposed in the third trench and under the second channel area; and a second gate electrode disposed on the second channel area, wherein lower portions of the first trench, the second trench, and the third trench are V-shaped, wherein the first channel area comprises a same material as the first well, the second channel area comprises a different material from the second well, and the stressor comprises a material having a different lattice constant from the first channel area, wherein the first buffer layer includes $Al_xGa_{1-x}N$ (0<X≤1), and an Al doping of the first buffer layer decreases upwardly toward the stressor, the first buffer layer comprises a first lower buffer layer and a first upper buffer layer disposed on the first lower buffer layer, and a portion of the first lower buffer layer is in direct contact with the stressor, wherein the first lower buffer layer covers substantially an entire side surface of the stressor, and wherein the first upper buffer layer covers substantially an entire bottom surface of the stressor, and wherein the second buffer layer includes $Si_yGe_{1-y}$ (0<y≤1), and a Ge doping of the second buffer layer increases upwardly toward the second channel area, the second buffer layer comprises a second lower buffer layer and a second upper buffer layer disposed on the second lower buffer layer, and a portion of the second lower buffer layer is in direct contact with the second channel area, wherein the second lower buffer layer covers substantially an entire side surface of the second channel area, and wherein the second upper buffer layer covers substantially an entire bottom surface of the second channel area.

16. The semiconductor device of claim 15,
wherein the first well is doped with P-type impurities, and the second well is doped with N-type impurities.

* * * * *